United States Patent
Briggs et al.

(10) Patent No.: US 9,714,700 B2
(45) Date of Patent: Jul. 25, 2017

(54) CVT PULLEY WITH ENGINEERED SURFACE

(75) Inventors: Roger L. Briggs, Lake Orion, MI (US); Martin S. Kramer, Clarkston, MI (US); Ronald P. Buffa, Fenton, MI (US); Matthew P. Werner, Idaho Falls, ID (US)

(73) Assignee: GM Global Technology Operations LLC, Detroit, MI (US)

( * ) Notice: Subject to any disclaimer, the term of this patent is extended or adjusted under 35 U.S.C. 154(b) by 1675 days.

(21) Appl. No.: 12/899,782

(22) Filed: Oct. 7, 2010

(65) Prior Publication Data

US 2012/0088615 A1    Apr. 12, 2012

(51) Int. Cl.
| | |
|---|---|
| F16H 55/56 | (2006.01) |
| B23K 26/36 | (2014.01) |
| B23K 26/00 | (2014.01) |
| C23C 14/02 | (2006.01) |
| C23C 14/06 | (2006.01) |
| F16H 55/38 | (2006.01) |
| F16H 61/662 | (2006.01) |

(52) U.S. Cl.
CPC ......... *F16H 55/56* (2013.01); *B23K 26/0084* (2013.01); *C23C 14/028* (2013.01); *C23C 14/0641* (2013.01); *F16H 55/38* (2013.01); *F16H 61/66272* (2013.01)

(58) Field of Classification Search
USPC .......................... 29/892; 219/121.68, 121.69
See application file for complete search history.

(56) References Cited

U.S. PATENT DOCUMENTS

| | | | | |
|---|---|---|---|---|
| 4,781,660 | A * | 11/1988 | Amataka et al. | 474/174 |
| 7,276,002 | B2 * | 10/2007 | Wang et al. | 474/8 |
| 7,294,077 | B2 * | 11/2007 | Wang et al. | 474/201 |
| 2005/0217111 | A1 * | 10/2005 | Yoshida et al. | 29/892 |
| 2008/0299408 | A1 * | 12/2008 | Guo et al. | 428/573 |
| 2009/0045179 | A1 * | 2/2009 | Williams | 219/121.72 |

FOREIGN PATENT DOCUMENTS

| | | |
|---|---|---|
| DE | 10057726 A1 | 6/2002 |
| EP | 1878948 A2 | 1/2008 |
| JP | 2001065651 A | 3/2001 |

OTHER PUBLICATIONS

Surface Finish (Measurement Methods), Aerospace Engineering Guide, Apr. 2008, pp. 21-22, Trelleborg Sealing Solutions.

* cited by examiner

*Primary Examiner* — William E Dondero
*Assistant Examiner* — Diem Tran
(74) *Attorney, Agent, or Firm* — Quinn IP Law

(57) ABSTRACT

A pulley for a continuously variable transmission and a method of creating an engineered surface on an outer surface of a pulley of a continuously variable transmission, with the engineered surface engaging with a belt or chain of the continuously variable transmission. The method comprising the steps of: determining an actual engineered roughness (Rpk) on the outer surface needed to obtain a predetermined friction between the engineered surface and the belt or chain; and etching microgrooves in at least a portion of the outer surface to create the engineered surface by employing a laser to etch the microgrooves, the microgrooves being formed to a depth that produces the actual engineered roughness (Rpk).

7 Claims, 1 Drawing Sheet

CVT PULLEY WITH ENGINEERED SURFACE

BACKGROUND OF INVENTION

The present invention relates generally to a continuously variable transmission (CVT), and more particularly to the surfaces on a pulley of the CVT.

Some continuously variable transmissions (CVT) use pulley assemblies with one truncated conical member that is movable relative to another truncated conical member, with a belt or chain mounted between them. The ratio of the input pulley to the output pulley is adjusted by varying the spacing between the conical members. The torque is transferred via friction between the conical members and the belt or chain.

In vehicles having engines with higher power output, the CVT needs to have a higher torque capacity. The higher torque capacity is achieved, in part, by maintaining a high frictional engagement between the belt/chain and the conical members. This must be achieved, however, while still providing adequate wear resistance of the conical surfaces to assure long term durability of the transmission. As the CVT is operated, the belt incurs micro-slippage due to torque transfer and the wrap angle difference between the primary and secondary pulleys. Over time, the micro-slippage causes a surface texture depth reduction due to mixed boundary lubrication conditions, which, with usage, may change the coefficient of friction between the belt and the pulley surface.

Pulleys with high surface roughness tend to have higher friction carrying capability with minimal slippage. As a result, the conical surfaces are treated to have a high average roughness (Ra). Some methods for creating this surface roughness may have included shot peening, grinding with a grinding wheel, stone polishing or tape polishing. While these mechanical methods of creating surface roughness produce a desired average, the roughness is random and not consistent, so the roughness just meets an overall average. The actual peak to valley height that determines the average roughness is not consistent throughout the treated surface area, thus a precise, engineered surface is not produced.

SUMMARY OF INVENTION

An embodiment contemplates a method of creating an engineered surface on an outer surface of a pulley of a continuously variable transmission, the engineered surface engaging with a belt or chain of the continuously variable transmission, the method comprising the steps of: determining an actual engineered roughness (Rpk) on the outer surface needed to obtain a predetermined friction between the engineered surface and the belt or chain; and etching microgrooves in at least a portion of the outer surface to create the engineered surface by employing a laser to etch the microgrooves, the microgrooves being formed to a depth that produces the actual engineered roughness (Rpk).

An embodiment contemplates a continuously variable transmission pulley that engages a belt or chain of the continuously variable transmission comprising a first pulley half and a second pulley half. The first pulley half has a first outer surface with a truncated conical shape, with a portion of the first outer surface having laser etched microgrooves therein of a predetermined depth that defines an actual engineered roughness (Rpk) for the portion of the first outer surface. The second pulley half has a second outer surface with a truncated conical shape that faces the first outer surface and is axially movable toward and away from the first outer surface, with a portion of the second outer surface having laser etched microgrooves therein of a predetermined depth that defines an actual engineered roughness (Rpk) for the portion of the second outer surface.

An advantage of an embodiment is that the consistency of the engineered surface roughness of the CVT pulleys allows for a reduction in the wear of the pulley surfaces while still providing the desired friction to meet torque demands on the transmission. The micro-machined slots created in the surface by the femto-pulsed laser can enhance oil retention and desirable hydrodynamic film characteristics of the pulley surfaces that allow for the desired torque transfer capability while reducing the surface wear.

DETAILED DESCRIPTION

Figure 1:
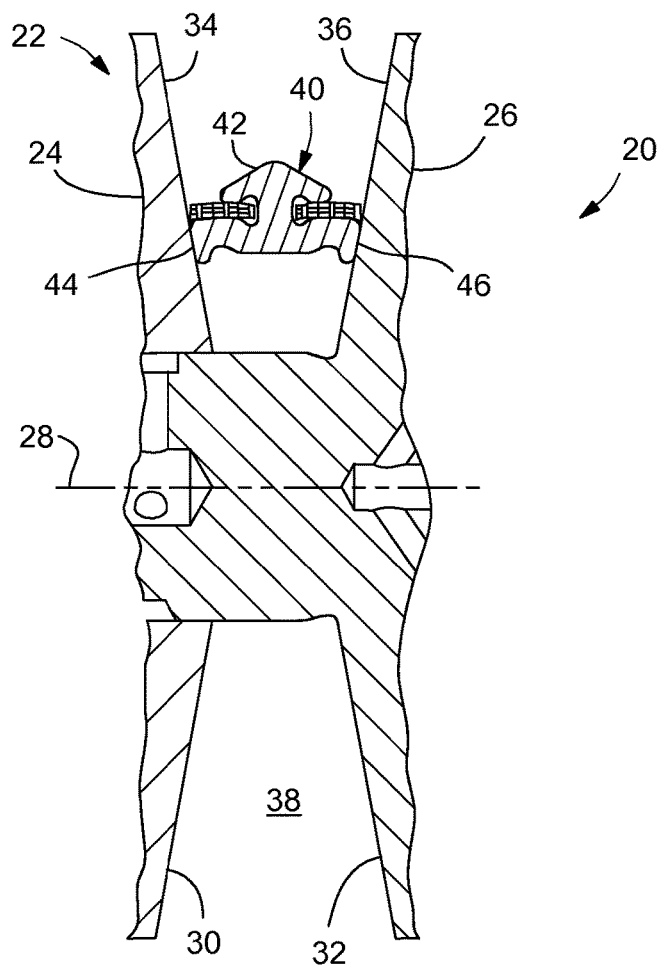
FIG. 1 is a schematic, cross sectional view of a portion of a continuously variable transmission.

Referring to FIG. 1, a portion of a continuously variable transmission (CVT), indicated generally at 20, is shown. The CVT 20 includes a pulley 22 having a first pulley half 24 facing a second pulley half 26. The second pulley half 26 is axially fixed relative to an axis of rotation 28, while the first pulley half 24 is axially slidable toward and away from the second half 26. This axial sliding motion may be provided using hydraulic, electronic or other means. The pulley halves 24, 26 may be made of, for example, a medium carbon steel—although other materials may be used instead, if so desired.

Each of the pulley halves 24, 26 has a truncated conical portion 30, 32, respectively, with outer surfaces 34, 36, respectively, that face each other. The outer surfaces 34, 36 are sloped relative to the axis 28 and form a resizable recess 38 within which is mounted a belt 40 (the belt only shown in the top half of the pulley). As the first pulley half 24 slides toward and away from the second pulley half 26, the belt 40 slides radially outward and radially inward, changing the drive ratio of the CVT.

The belt 40 includes elements 42, the sides 44, 46 of which frictionally engage the outer surfaces 34, 36, respectively. This frictional engagement is important for transmitting the torque between the belt 40 and the pulley halves 24, 26. For a high torque transfer, the frictional engagement needs to be relatively high, but lubrication and wear resistance of these surfaces must also be taken into consideration.

Figure 2:
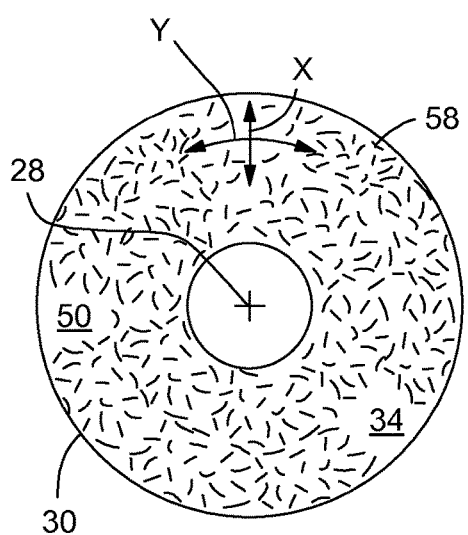
FIG. 2 is a schematic elevation view of a surface of a pulley.

FIG. 2 illustrates the first outer surface 34 of the first truncated conical portion 30. This discussion applies equally to the second outer surface 36 and so it will not be shown or discussed separately. This outer surface 34 rotates around the axis of rotation 28 and has a surface treated area 50, which may cover the entire first outer surface 34.

An engineered surface roughness of the surface treated area 50 is created by employing a femto-pulsed laser. The laser is used to create microgrooves 58 (indicated schematically by the small lines in FIG. 2) that not only meet an average roughness number (Ra), but that create an actual roughness (Rpk) that is consistent for essentially all of the peak to valley heights of the microgrooves 58. This precise and consistent control of actual peak to valley ratio (Rpk) allows for better control over how much friction is achieved on the surface 50. The microgrooves 58 also enhance oil retention and desirable hydrodynamic film characteristics. The utilization of the femto-pulsed laser also may eliminate any need for post machining, thus maintaining the actual engineered roughness (Rpk) created without variations in roughness from one pulley to another that may be created in a post machining operation.

The microgrooves 58 may be formed as dots or dashes or other shapes on the surface, and may be oriented in a radial direction (X), a circumferential direction (Y) or a combination of the two.

In addition to the microgrooves 58 created by the femto-pulsed laser, a physical vapor deposition (PVD) process may be employed to coat the first outer surface 34 with a material such as chromium nitride (CrN) to further improve the wear characteristics of this surface. The PVD process may be conducted before or after the creation of the microgrooves 58, but is preferably performed after the creation of the microgrooves 58.

Figure 3:
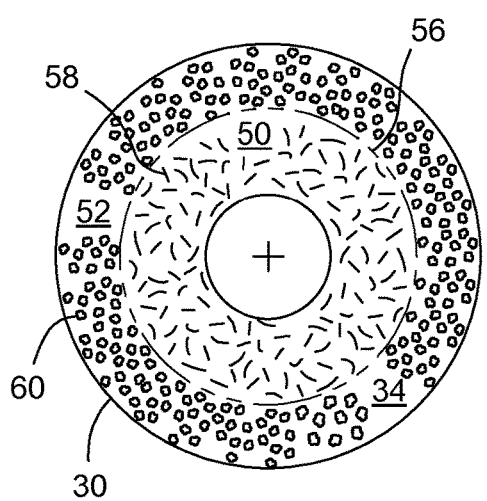
FIG. 3 is a schematic view similar to FIG. 2, but illustrating a somewhat different surface finish configuration.

FIG. 3 illustrates a modification of the first outer surface 34 of the first truncated conical portion 30. This outer surface 34 has two different circumferentially extending, surface treated areas 50, 52. The first surface treated area 50 is radially inward of the second surface treated area 52. The phantom circle in FIG. 3 indicates the border 56 between the two areas 50, 52. The first surface treated area 50 is treated the same as the surface in FIG. 2, with the femto-pulsed laser creating the microgrooves 58 for a precise, engineered surface roughness. The second surface treated area 52 may be treated by a more conventional mechanical method of creating surface roughness, such as, for example, shot peening, grinding, stone polishing or tape polishing. The mechanical methods produce surface features 60 (indicated schematically by the small irregular shapes in FIG. 3) that create a random, average surface roughness (Ra), rather than a more precisely engineered surface roughness of a femto-laser. However, the cost is less and, for particular pulley configurations, the torque is much higher when the belt is radially inward on the pulley and significantly lower when radially out farther. Thus, the precise frictional characteristics are not as critical on the radially outer portion of the outer surface 34.

While certain embodiments of the present invention have been described in detail, those familiar with the art to which this invention relates will recognize various alternative designs and embodiments for practicing the invention as defined by the following claims.

What is claimed is:

1. A method of creating an engineered surface comprising the steps of:
 (a) providing an outer surface of a pulley of a continuously variable transmission, the surface being engageable with a belt or chain, with at least a portion of the outer surface to include the engineered surface; and
 (b) etching microgrooves in at least the portion of the outer surface to create the engineered surface by employing a laser to etch the microgrooves, the microgrooves being formed to produce a predetermined actual engineered roughness (Rpk).

2. The method of claim 1 wherein step (b) is further defined by the laser being a femto-pulsed laser.

3. The method of claim 1 wherein step (b) is further defined by the microgrooves being etched throughout the entire outer surface to create the engineered surface.

4. The method of claim 1 wherein step (b) is further defined by the microgrooves being etched throughout a radially inner area of the outer surface to create the engineered surface; and wherein the method includes step (c) creating a predetermined average surface roughness (Ra) throughout a radially outer area of the outer surface by employing a mechanical method of creating surface roughness.

5. The method of claim 4 wherein step (c) is further defined by the average surface roughness (Ra) in the radially outer area being created by employing at least one of shot peening, grinding, stone polishing and tape polishing.

6. The method of claim 4 including step (d) coating the outer surface with chromium nitride after completing step (b).

7. The method of claim 1 wherein the laser etches the microgrooves to also create a predetermined average surface roughness (Ra).

\* \* \* \* \*